(12) United States Patent
Fujikura

(10) Patent No.: US 11,552,218 B2
(45) Date of Patent: Jan. 10, 2023

(54) ALUMINUM NITRIDE LAMINATE MEMBER AND LIGHT-EMITTING DEVICE

(71) Applicant: SUMITOMO CHEMICAL COMPANY, LIMITED, Tokyo (JP)

(72) Inventor: Hajime Fujikura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 244 days.

(21) Appl. No.: 16/783,916

(22) Filed: Feb. 6, 2020

(65) Prior Publication Data
US 2020/0259046 A1 Aug. 13, 2020

(30) Foreign Application Priority Data

Feb. 13, 2019 (JP) .............................. JP2019-023916
Aug. 20, 2019 (JP) .............................. JP2019-150308

(51) Int. Cl.
H01L 29/15 (2006.01)
H01L 33/22 (2010.01)
H01L 33/32 (2010.01)
C30B 29/20 (2006.01)
H01L 33/00 (2010.01)
C30B 29/40 (2006.01)
H01L 33/12 (2010.01)

(52) U.S. Cl.
CPC .............. H01L 33/22 (2013.01); C30B 29/20 (2013.01); C30B 29/403 (2013.01); H01L 33/007 (2013.01); H01L 33/12 (2013.01); H01L 33/32 (2013.01)

(58) Field of Classification Search
CPC ....... H01L 33/22; H01L 33/007; H01L 33/12; H01L 33/32
See application file for complete search history.

(56) References Cited

U.S. PATENT DOCUMENTS

2014/0239339 A1* 8/2014 Huang ................ H01L 21/0243
257/99
2019/0081209 A1* 3/2019 Michiue .............. H01L 21/0243

OTHER PUBLICATIONS

Fujita et al., "HVPE growth of thick AlN on trench-patterned substrate," Physica Status Solidi C, vol. 8, No. 5, 2011, pp. 1483-1486.
Zhang et al., "High-quality AlN epitaxy on nano-patterned sapphire substrates prepared by nano-imprint lithography," Scientific Reports, vol. 6, 2016, pp. 1-8.

* cited by examiner

Primary Examiner — Samuel A Gebremariam
(74) Attorney, Agent, or Firm — Foley & Lardner LLP

(57) ABSTRACT

There is provided an aluminum nitride laminate member including: a sapphire substrate having a base surface on which bumps are distributed periodically, each bump having a height of smaller than or equal to 500 nm; and an aluminum nitride layer grown on the base surface and having a flat surface, there being substantially no voids in the aluminum nitride layer.

14 Claims, 5 Drawing Sheets

ALUMINUM NITRIDE LAMINATE MEMBER AND LIGHT-EMITTING DEVICE

BACKGROUND

Technical Field

The present disclosure relates to an aluminum nitride laminate member and a light-emitting device.

Description of the Related Art

Techniques for growing an aluminum nitride (AlN) layer on a sapphire substrate on which a periodic bump-and-dip shape is formed are proposed, for example, as a method for producing ultraviolet light-emitting diodes (UV-LEDs) (see, for example, non-patent document 1). A shape in which dips are distributed periodically (while being spaced apart) and a shape in which bumps are distributed periodically (while being spaced apart) are known as the bump-and-dip shape of a sapphire substrate (for the technique for growing an AlN layer on a sapphire substrate on which dips are provided, see, for example, non-patent document 2).

Non-patent document 1: H. Miyake, etc. "HVPE growth of thick AlN on trench-patterned substrate", Phys Status Solidi C 8, No. 5, 1483-1486 (2011)

Non-patent document 2: Zhang et al., "High-quality AlN epitaxy on nano-patterned sapphire substrates prepared by nano-imprint lithography", Scientific Reports 6, 35934 (2016)

In the state of the art, use of a sapphire substrate having periodically distributed bumps results in the growth of irregular, disorderly AlN crystals, so it is not possible to grow an AlN layer in such a way that the layer has a flat surface.

Further, although it is possible to form an AlN layer having a flat surface using a sapphire substrate on which dips are distributed periodically, use of such a technique results in the formation of voids in the AlN layer (see non-patent document 2). Such voids, as will be described later, constitute a disadvantage when the obtained AlN layer is used for a UV-LED, for example.

SUMMARY

An objective of the present disclosure is to provide an AlN laminate member which includes a sapphire substrate on which bumps are distributed periodically and an AlN layer that is grown on the sapphire substrate in such a way that the AlN layer has a flat surface and there are substantially no voids in the AlN layer.

Another objective of the present disclosure is to provide a light-emitting device including such an AlN laminate member.

In an aspect of the present disclosure, there is provided an aluminum nitride laminate member including a sapphire substrate having a base surface on which bumps are distributed periodically, each bump having a height of smaller than or equal to 500 nm, and an aluminum nitride layer grown on the base surface and having a flat surface, there being substantially no voids in the aluminum nitride layer.

In another aspect of the present disclosure, there is provided a light-emitting device including the aluminum nitride laminate member provided in the aforementioned aspect.

There is provided an aluminum nitride laminate member which includes a sapphire substrate on which bumps are distributed periodically and an aluminum nitride layer that is grown on the sapphire substrate in such a way that the aluminum nitride layer has a flat surface and there are substantially no voids in the aluminum nitride layer. Also provided is a light-emitting device including such an AlN laminate member.

DETAILED DESCRIPTION OF THE DISCLOSURE

Embodiment

Figure 1:
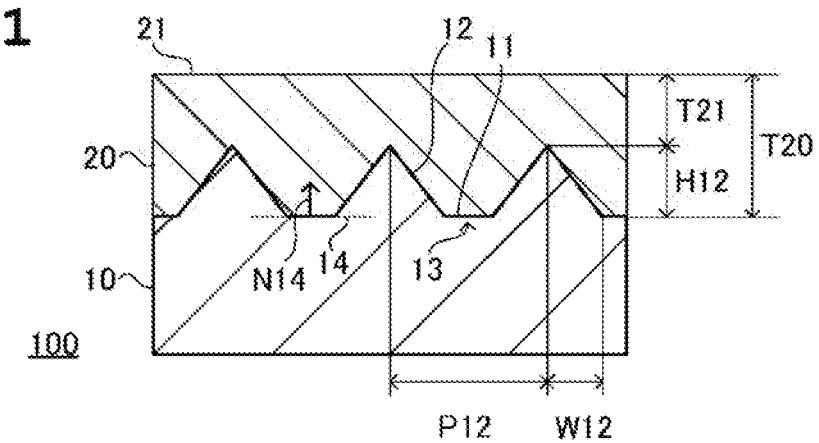
FIG. 1 is an illustrative schematic cross-sectional diagram of a laminate member 100 in an embodiment of the present disclosure.

Described will be an aluminum nitride (AlN) laminate member 100 (also referred to as "laminate member 100" below) in an embodiment of the present disclosure. FIG. 1 is an illustrative schematic cross-sectional diagram of the laminate member 100 in this embodiment. The laminate member 100 includes a sapphire substrate 10 (also referred to as "substrate 10" below) and an AlN layer 20 (also referred to as "layer 20" below) grown on the substrate 10. The layer 20 in this embodiment is characterized in that a surface 21 thereof is a flat surface formed through growth and that there are substantially no voids in the layer 20.

The substrate 10 is formed from single crystal sapphire and has a base surface 11 serving as a base on which to grow the layer 20. The base surface 11 has a plurality of bumps 12 that are distributed periodically (while being spaced apart). The shape of each bump 12 may be conical, for example. In this embodiment, a "conical" shape encompasses the shape of a circular cone and a pyramid, and encompasses not only a shape having a sharp apex but also a shape having a flat apex (truncated cone). This example illustrates a mode in which the bumps 12 are circular cones.

Portions 13 of the base surface 11 that are located on the outside of the bumps 12 (these portions 13 will also be referred to as "valleys 13" below) are located on a (virtual) plane 14. The bumps 12 can be regarded as being distributed on the plane 14, and the direction N14 normal to the plane 14 coincides with the height direction of the bumps 12. The height H12 of each bump 12 is defined by the distance between the plane 14 and the upper end of the bump 12. The bumps 12 are formed in such a way that the height direction of the bumps 12 is parallel to the c-axis direction of the sapphire forming the substrate 10. The sapphire c-face is exposed at the apex of each bump 12. Note that in this description, the concept of one direction D1 being parallel to another direction D2 means that the angle formed between the directions D1 and D2 is no more than 3 degrees.

Figure 2:
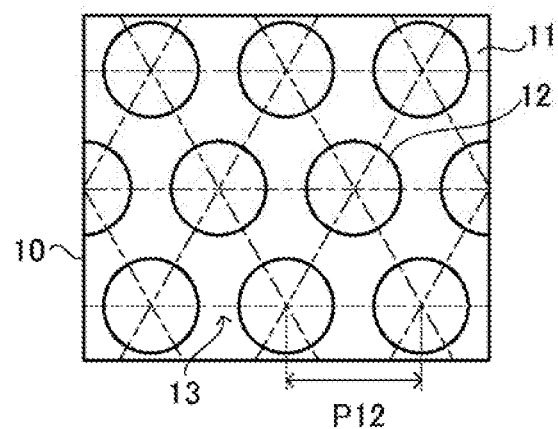
FIG. 2 is an illustrative schematic plan view of a substrate 10 in the embodiment.

FIG. 2 is an illustrative schematic plan view of the substrate 10. In this embodiment, the bumps 12 may be distributed on lattice points of a triangular lattice, a quadrangular lattice, a hexagonal lattice, or the like, thereby being distributed in a two-dimensionally periodic fashion (while being spaced apart). This example illustrates a mode in which the bumps 12 are distributed on lattice points of an equilateral triangular lattice. The axial directions of the equilateral triangular lattice are indicated by the dash dot lines. The axial directions of the lattice (e.g. triangular lattice) in which the bumps 12 are distributed are not particularly limited, but may be, for example, parallel to an m-axis direction or an a-axis direction of the sapphire forming the substrate 10.

The layer 20 is formed from AlN that is heteroepitaxially grown on the base surface 11 of the substrate 10. The surface (upper surface) 21 of the layer 20 is a flat surface that is formed through the growth. The surface 21 being a flat surface (or being flat) means that the surface 21 has a surface roughness of typically no more than 3 nm in terms of a root mean square (RMS) value measured over a 5 μm square area using atomic force microscopy (AFM). While the base surface 11 of the substrate 10 has a bump-and-dip shape corresponding to the bumps 12, the surface 21 of the layer 20 is flat. In other words, the layer 20 grows while filling the valleys 13 of the base surface 11, resulting in the formation of the surface 21 that is a flat surface.

There are substantially no voids in the layer 20. That is to say, the layer 20 fills the valleys 13 between the bumps 12 completely. The definition of there being "substantially no voids" in the layer 20 will be explained later.

As a result of the crystal orientation of the AlN forming the layer 20 being controlled by the sapphire single crystal exposed at the base surface 11 of the substrate 10, the c-axis direction of the AlN is parallel to the height direction of the bumps 12. In other words, the c-axis direction of the AlN forming the layer 20 is parallel to (more or less coincides with) the c-axis direction of the sapphire forming the substrate 10. The closest low-index crystal face to the surface 21 is the +c face (Al polar face) of the AlN forming the layer 20. The AlN forming the layer 20 is a single crystal and the surface 21 has a single crystal orientation.

As will be described in the experiment example below (see FIG. 3), the surface 21 of the layer 20 has a step-and-terrace structure, and the AlN forming the layer 20 has high crystallinity. Preferably, the full width at half maximum of the AlN forming the layer 20 in terms of x-ray rocking curve (XRC) measurement is, for example, smaller than or equal to 300 seconds for the (0002) diffraction, and, for example, smaller than or equal to 500 seconds for the (10-12) diffraction.

The surface 21 is a flat surface formed through growth (i.e. an as-grown flat surface) and is not a flat surface that is obtained by being flattened through processing such as rubbing, so is free of damage on the AlN crystal that may be caused by such processing. Accordingly, the surface 21 is such that if another AlN layer is homoepitaxially grown on the surface 21, the other AlN layer can be grown in such a way that the full width at half maximum of the AlN forming the other AlN layer in terms of XRC measurement remains at or below, without significantly exceeding, the full width at half maximum of the AlN forming the layer 20 in terms of XRC measurement (i.e. the crystallinity of same does not drop below the crystallinity of the layer 20). The expression "remains at or below, without significantly exceeding" means that the full width at half maximum of the other AlN layer is equivalent to or drops below the full width at half maximum of the layer 20, or even if it exceeds same, the amount of excess is limited to no greater than 100 seconds, i.e. the amount by which the full width at half maximum of the other AlN layer exceeds the full width at half maximum of the layer 20 is no greater than 100 seconds. This full width at half maximum may be the full width at half maximum for the (0002) diffraction, for example, or the full width at half maximum for the (10-12) diffraction, for example.

The layer 20 is formed from an AlN layer constituted by a single layer. An "AlN layer constituted by a single layer" means that the layer is not an AlN layer (also referred to as an "AlN layer constituted by multiple layers" below) that is constituted by a laminate of multiple AlN sublayers having, for example, mutually dissimilar concentrations of impurities such as oxygen. In an AlN layer constituted by multiple layers, concentration of impurities such as oxygen changes stepwise at boundaries between the AlN sublayers. Accordingly, an "AlN layer constituted by a single layer" may be expressed as being an AlN layer in which there are no boundaries at which concentration of impurities such as oxygen changes stepwise at an intermediate position in the thickness direction.

The inventors of the present disclosure have discovered that in order for the layer 20 to be grown in such a way as to form the surface 21 into a flat surface, it is preferable for the height H12 of the bumps 12 to be lower. Specifically, the height H12 of each bump 12 is preferably smaller than or equal to 500 nm, more preferably smaller than or equal to 300 nm. Meanwhile, although there are no particular limitations on the lower limit for the height H12 of the bumps 12, from the standpoint of giving a clear definition of the bumps 12, the height H12 of each bump 12 may be set to larger than or equal to 50 nm, more preferably larger than or equal to 100 nm, for example.

As will be described later, it is preferable that the layer 20 be grown by vapor phase epitaxy, e.g. hydride vapor phase epitaxy (HYPE), and the base surface 11 undergoes heat treatment before growth of the layer 20, the heat treatment involving exposure of the base surface 11 to gas containing oxygen (O), preferably oxygen gas ($O_2$ gas) (this heat treatment will also be referred to as "oxygen gas treatment" below). It is considered that as a result of the base surface 11 being roughened due to the oxygen gas treatment, the readiness of adherence of Al atoms is increased over the entirety of the base surface 11, and moreover, the adherence is facilitated in such a way that the crystal orientation of the AlN conforms to the sapphire.

It is considered that, in this embodiment, since the height H12 of the bumps 12 is sufficiently low and, moreover, the readiness of adsorption of Al atoms over the entirety of the base surface 11 is increased due to the oxygen gas treatment, the valleys 13 are filled easily. Preferable growth conditions (growth temperature, V/III ratio, etc.) for growing the layer 20 such that the surface 21 forms into a flat surface and there are substantially no voids in the layer 20 will be described later.

In order to form the surface 21 of the layer 20 into a flat surface, the layer 20 is grown up to a height (thickness) that exceeds the upper ends of the bumps 12. In other words, the thickness T20 of the layer 20 from the valleys 13 (lower ends of the bumps 12) to the surface 21 is larger than the height H12 of the bumps 12. In this embodiment, the thickness T20 of the layer 20 from the lower ends of the bumps 12 to the surface 21, sufficient to form the surface 21 into a flat surface, can be made to be smaller than or equal to 800 nm by setting the height H12 of the bumps 12 to smaller than or equal to 500 nm and growing the layer 20 on the base surface 11 that has undergone the oxygen gas treatment.

It can be said that an increase in the width W12 of a slant surface of the bump 12 in a plan view or an increase in the pitch P12 between closest adjacent bumps 12 results in an increase in the degree of convexity and concavity in the base surface 11 and an increase in the difficulty of flattening the surface 21 of the layer 20. The width W12 being smaller than or equal to 500 nm, for example, and the pitch P12 being smaller than or equal to 1000 nm, for example, may be presented as rough indices for the convexity and concavity of the base surface 11 with which a flat surface 21 can be achieved in this embodiment.

Next, a method of manufacturing the laminate member 100 will be described. The substrate 10 is prepared. The height H12 of the bumps 12 on the substrate 10 is set to be smaller than or equal to 500 nm. It is preferable that the width W12 of the slant surfaces of the bumps 12 be smaller than or equal to 500 nm and that the pitch P12 of the bumps 12 be smaller than or equal to 1000 nm. Such a substrate 10 can be produced using a technique for forming patterned sapphire substrates (PSS). The base surface 11 of the substrate 10 is subjected to oxygen gas treatment. For the oxygen gas treatment, it is preferable that, for example, the heating treatment be carried out for 10-30 minutes at a temperature of 800° C.-1100° C. in a tubular furnace in which oxygen gas flows at a flow rate of about 2 slm. Oxidization of the base surface 11 using oxygen plasma is also a preferable form of oxygen gas treatment.

On the base surface 11 having undergone the oxygen gas treatment, AlN is grown by vapor phase epitaxy, preferably HVPE, to form the layer 20. Aluminum monochloride (AlCl) gas or aluminum trichloride ($AlCl_3$) gas, for example, may be used as aluminum (Al) raw material gas, and ammonia ($NH_3$) gas may be used as nitrogen (N) raw material gas. These raw material gases may be supplied while being mixed with a carrier gas for which hydrogen gas ($H_2$ gas), nitrogen gas ($N_2$ gas), or a gas mixture of the two is used.

The following is an example of growth conditions. The growth temperature may be 1000° C.-1300° C. The V/III ratio, i.e. the supply ratio of N raw material gas to Al raw material gas, may be 0.2-200. The growth speed may be 0.5-500 nm/min. For the purpose of preventing adhesion of AlN to nozzles of gas supply pipes used to introduce various gases to a growth chamber in an HVPE apparatus, hydrogen chloride (HCl) gas may be flown, and the amount of HCl gas supplied may be set such that the ratio of the HCl gas to the AlCl gas or the $AlCl_3$ gas is 0.1-100.

According to the above, the layer 20, the surface 21 of which is a flat surface and in which there are substantially no voids, is grown. The thickness T20 of the layer 20 may be adjusted, as appropriate, provided that the thickness T20 is larger than or equal to a thickness according to which the surface 21 can be formed into a flat surface. However, an excessively large thickness T20 may lead to the generation of cracks in the layer 20. Thus, it is preferable that the thickness T20 of the layer 20 be, for example, smaller than or equal to 800 nm.

Figure 7A:
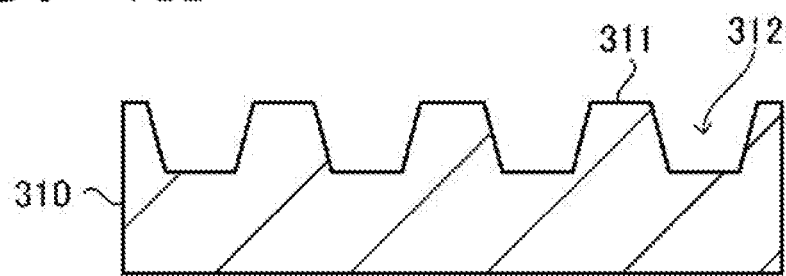
FIGS. 7A and 7B are cross-sectional diagrams schematically illustrating a patterned sapphire substrate used in a conventional technique and an AlN layer grown on the patterned sapphire substrate using a conventional technique.
Figure 7B:
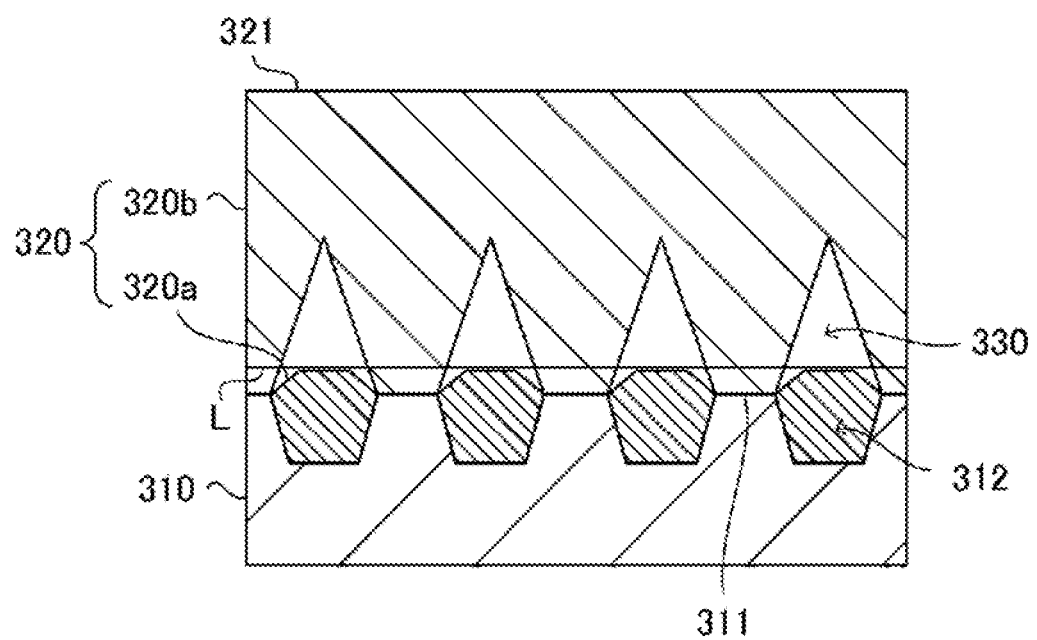

Now, for the purpose of articulating the characteristics of the AlN layer 20 in this embodiment, characteristics of an AlN layer grown on a patterned sapphire substrate using a conventional technique will be described. Growth of AlN on a patterned sapphire substrate using a conventional technique is exemplified by, for example, "High-quality AlN epitaxy on nano-patterned sapphire substrates prepared by nano-imprint lithography", Scientific Reports 6, 35934 (2016). FIGS. 7A and 7B are cross-sectional diagrams schematically illustrating a patterned sapphire substrate 310 used in a conventional technique and an AlN layer 320 grown on the patterned sapphire substrate 310 using a conventional technique.

With conventional techniques, unlike this embodiment, a patterned substrate of the type in which dips 312 (holes or grooves) are formed periodically (while being spaced apart) on the sapphire substrate 310 is used in most cases. The dips 312 are distributed periodically. To cite a specific example, a sapphire substrate 310 used in conventional techniques is structured so that (see FIG. 2) on lattice points of a triangular lattice, or other such lattice, in which bumps 12 are distributed in this embodiment, there are distributed dips 312, rather than bumps 12. In this structure, the pitch between the dips 312 is long, i.e. from less than 1 micrometer to several tens of micrometers, and the dips 312 have a large depth, i.e. from less than 1 micrometer to several tens of micrometers. Metal organic chemical vapor deposition (MOCVD) or HVPE is used as a method for growing the AlN layer 320.

In conventional techniques, the AlN layer 320 grows on all of the surfaces 311 between the dips 312, the slant surfaces of the dips 312, and the bottom surfaces of the dips 312 in the sapphire substrate 310 in such a way that the AlN layer 320 has c-axes that are perpendicular to each of these surfaces. The AlN layer 320 as a whole is formed from AlN crystals 320a grown on the dips 312 and AlN crystals 320b grown on the surfaces 311.

The AlN grown on the slant surfaces of the dips 312 has a different crystal orientation from the AlN grown on the surfaces 311, resulting in a disorderly crystal. Further, the AlN grown on the slant surfaces of the dips 312 and the AlN grown on the bottom surfaces of the dips 312 also have differing crystal orientations, and hence disorderly AlN crystals 320a are formed in the dips 312.

Meanwhile, the crystal orientations of the AlN crystals 320b grown on the surfaces 311 and the sapphire substrate 310 coincide with each other, yet there is a difference in height between the surfaces 311 and the dips 312, so the AlN crystals 320b grown on the surfaces 311 and the AlN crystals 320a grown on the dips 312 grow while keeping a distance therebetween.

Under certain growth conditions, the AlN grown on the surfaces 311 can, although slowly, be spread sideways. By modifying the growth conditions so that a disorderly AlN crystal 320a grown on a dip 312 does not reach an AlN crystal 320b until AlNs grown on adjacent surfaces 311 across the dip 312 meet, an AlN crystal 320b that has a flat surface 321 can eventually be obtained. In a condition in which a flat surface 321 can eventually be obtained, there will inevitably be voids 330 in the AlN layer 320 because the disorderly AlN crystal 320a grown on the dip 312 does not reach the AlN crystal 320b grown on the surfaces 311.

Moreover, when an attempt is made to form a flat surface 321 with conventional techniques, since the speed at which the growing AlN crystals 320b spread sideways is low, it is necessary to grow thick AlN crystals 320b having a thickness of about 5-20 μm.

So, when an attempt is made to form a flat surface 321 with conventional techniques, there will be voids 330 in the AlN layer 320 and, moreover, it is necessary to grow a thick AlN layer 320. These conditions constitute a disadvantage when it is intended to use the AlN layer 320 for, for example, the base of a UV-LED, as described below.

The UV-LED is formed as a result of an n-type semiconductor layer, a light-emitting layer, and a p-type semiconductor layer being grown on the flat surface 321 of the AlN layer 320. For the p-type semiconductor layer, it would be ideal to use a p-type aluminum gallium nitride (AlGaN) layer, or the like, that is transparent to ultraviolet rays; however, use of a p-type AlGaN layer results in an excessively high resistance. So, in the state of the art, a p-type GaN layer that absorbs ultraviolet rays is being used at least for outermost contact layers. As a result, even when it is intended to extract ultraviolet rays to the growth surface side, almost all light is absorbed by the p-type GaN layer. Accordingly, for state-of-the-art UV-LEDs, a structure is adopted in which light is extracted from the back side of the sapphire substrate.

According to studies conducted by the inventors of the present disclosure, when such a structure is adopted, since there are voids 330 in the AlN layer 320, an average refractive index around the boundary between the AlN layer 320 and the sapphire substrate 310 decreases, so ultraviolet rays generated at the light-emitting layer are transmitted with less ease to the substrate side. In other words, the AlN layer 320 containing voids 330 results in a decrease in the output of a UV-LED and therefore constitutes a disadvantage. Moreover, the need to grow a thick AlN layer 320 constitutes a disadvantage in terms of UV-LED production cost reduction.

Next, an experiment example pertaining to this embodiment will be described. In this experiment example, a 2-inch diameter substrate 10 (sapphire substrate) in which circular conical bumps 12 are distributed in the form of an equilateral triangular lattice was used. The height H12, slant-surface width W12, and pitch P12 of the bumps 12 were set to 220 nm, 250 nm, and 600 nm, respectively. The growth conditions exemplified above were adopted as the growth conditions for the layer 20 (AlN layer). The layer 20 was grown in such a way that the thickness T20 thereof from the valleys 13 in the base surface 11 of the substrate 10 to the surface 21 of the layer 20 would be 700 nm.

Figure 3:
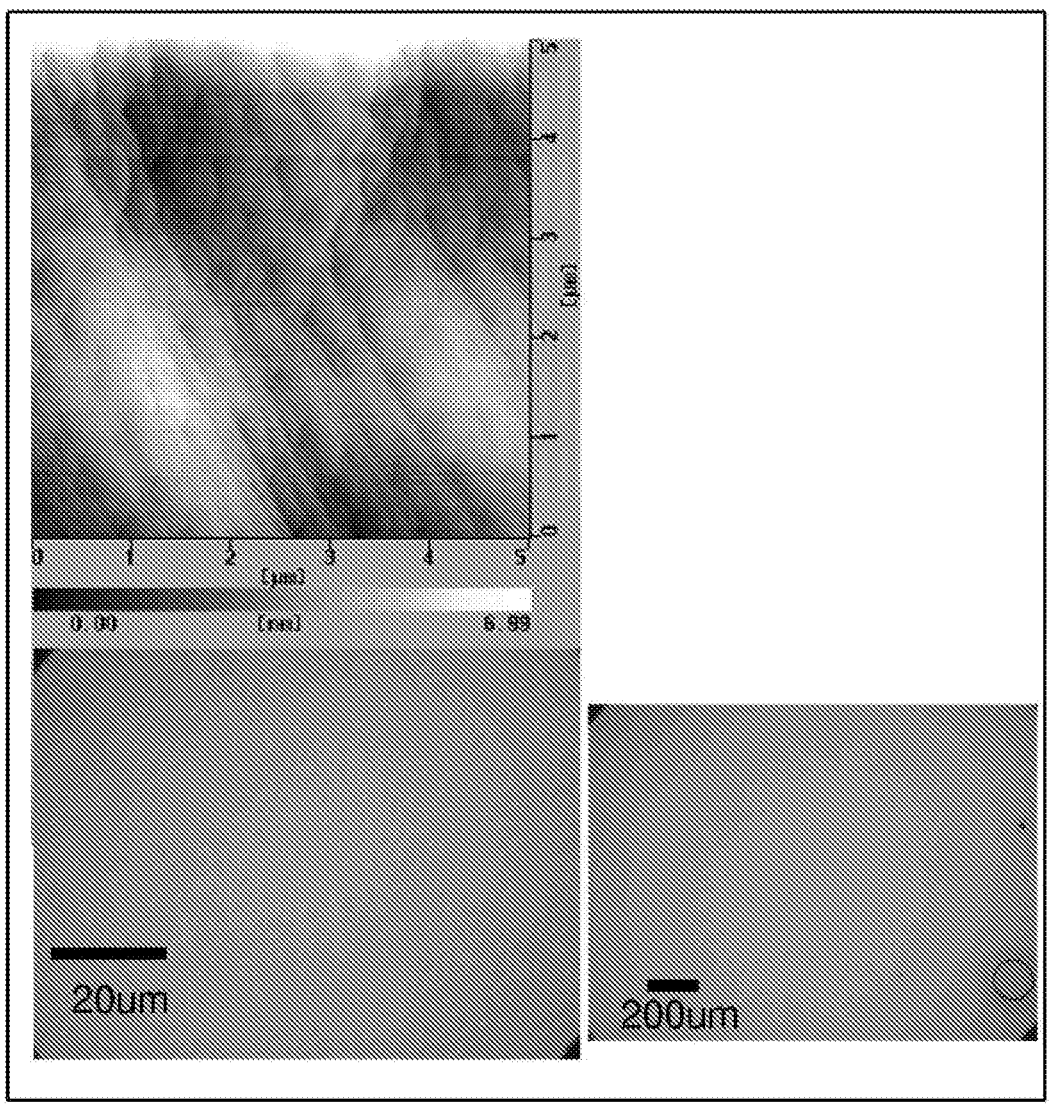
FIG. 3 is an AFM image and optical microscopy images showing results of an experiment example.
Figure 4:
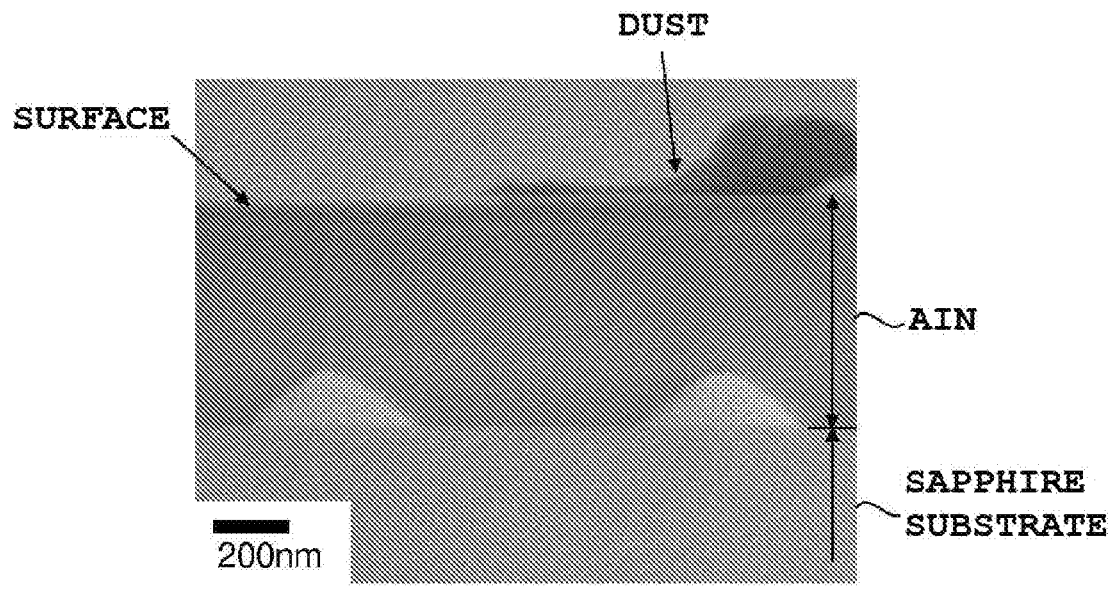
FIG. 4 is a cross-sectional SEM image showing results of the experiment example.

FIGS. 3 and 4 show results of this experiment example. FIG. 3 is a planar image showing results of this experiment example. The upper part of FIG. 3 presents an image of a 5 μm square area in the surface of the AlN layer, captured using atomic force microscopy (AFM), and the lower left and right parts of FIG. 3 present optical microscopy images of the surface of the AlN layer. As can be seen from the AFM image, the surface of the AlN layer is flat and a step-and-terrace structure can be observed in the surface. Presumably, the height of each step in the step-and-terrace structure is equivalent to one or two molecules of AlN. The RMS value of the surface roughness measured using AFM in this case was 1.6 nm; when the measurement was carried out over the entire 2-inch wafer at 10 mm-pitch intervals, the result showed an RMS value of smaller than or equal to 3 nm at all measurement sites. The optical microscopy image is also showing that the surface of the AlN layer is flat.

Results of an XRC measurement carried out for the AlN layer produced according to this experiment example for the central part of the 2-inch wafer showed a full width at half maximum of 260 seconds for the (0002) diffraction and a full width at half maximum of 300 seconds for the (10-12) diffraction. When the measurement was carried out over the entire 2-inch wafer at 10 mm-pitch intervals, the full width at half maximum for the (0002) diffraction was smaller than or equal to 300 seconds at all measurement sites and the full width at half maximum for the (10-12) diffraction was smaller than or equal to 500 seconds at all measurement sites.

FIG. 4 is a cross-sectional scanning electron microscopy (SEM) image showing results of this experiment example. The cross-section coincides with a plane (sapphire M face and AlN A face) perpendicular to the arrow P12 in FIG. 2, i.e. a plane perpendicular to the surface of the AlN layer. Due to the charge-up effect at the time of imaging, the size shown in the image looks slightly different from the actual size; nonetheless, even from this cross-sectional image, it is evident that the AlN formed has a flat surface and that there are no voids in the crystal forming the AlN layer. It should be mentioned that when the cross-section was observed over a wider range, there were very occasionally found sites at which formation of voids was identified; however, this is the result of unevenness due to the incompleteness of patterning in the sapphire substrate and is irrelevant to the intrinsic properties of the AlN layer.

The amount of voids in the AlN layer may be determined as follows, for example. In a low-magnification cross-sectional SEM image ("low-magnification" meaning a magnification at which regions having a width of larger than or equal to 10 μm can be observed), a line L parallel to the surface of the AlN layer and having a length of larger than or equal to 10 μm is depicted in the AlN layer so that the length over which the line L traverses (a) void(s) would be maximized; in this condition, the ratio of the length of the void(s) to the length of the line L (i.e. the length over which the line L traverses the void(s)) is defined as "void content percentage". The amount of voids in the AlN layer may be determined according to such void content percentage, for example. A condition in which the void content percentage is lower than or equal to 10% may be defined as a condition in which there are substantially no voids in the AlN layer.

In this experiment example, the void content percentage was lower than or equal to 10%, lower than or equal to 5% in most cases, and 0% in optimal conditions. In other words, in the AlN layer obtained in this experiment example, there were substantially no voids. The void content percentage is preferably lower than or equal to 5%, more preferably lower than or equal to 2%, and even more preferably 0% (lower than 0.5%).

FIG. 7B conceptually exemplifies a line L depicted for the purpose of determining a void content percentage in an AlN layer 320 according to conventional techniques. In the AlN layer 320 according to conventional techniques, the void content percentage exceeds 10%.

As has been described above, according to this embodiment, a laminate member 100 can be achieved which includes a substrate 10 having a base surface 11 on which bumps 12 are distributed periodically, and a layer 20 that is grown on the base surface 11 in such a way that the layer 20 has a flat surface 21 and there are substantially no voids in the layer 20. The flat surface 21 can be obtained through growth, that is, in the form of an as-grown surface. Thus, there is no need for processing for flattening the surface 21 and damage to the AlN crystal due to such processing can therefore be prevented. So, when, for example, a group-III nitride layer is to be further grown on the surface 21 of the layer 20, the group-III nitride layer can be grown with high crystallinity.

The layer 20 can be grown as an AlN layer constituted by a single layer, i.e. through a single growth process. Thus, the layer 20 can be formed more easily than an AlN layer constituted by multiple layers requiring multiple growth processes.

The height H12 of the bumps 12 on the substrate 10 is smaller than or equal to 500 nm and the thickness T20 of the layer 20 can be reduced to smaller than or equal to 800 nm, as described above. This facilitates formation of the layer 20 into a high-quality AlN layer free of cracks. In addition, since the layer 20 in this embodiment has a significantly smaller thickness than AlN layers formed with conventional techniques (having a thickness of 5-20 μm, for example), there is also an advantage in that costs involved in the growth can be cut significantly.

The laminate member 100 may be used in applications such as production of LEDs by further growing a group-III nitride layer on the surface 21 of the layer 20. Since there are substantially no voids in the layer 20, it is possible to limit a decrease in outputs due to voids when the laminate member 100 is used for the base of an LED, for example, as will be described below. Note that the laminate member 100 may also be adopted in any other applications.

Figure 5:
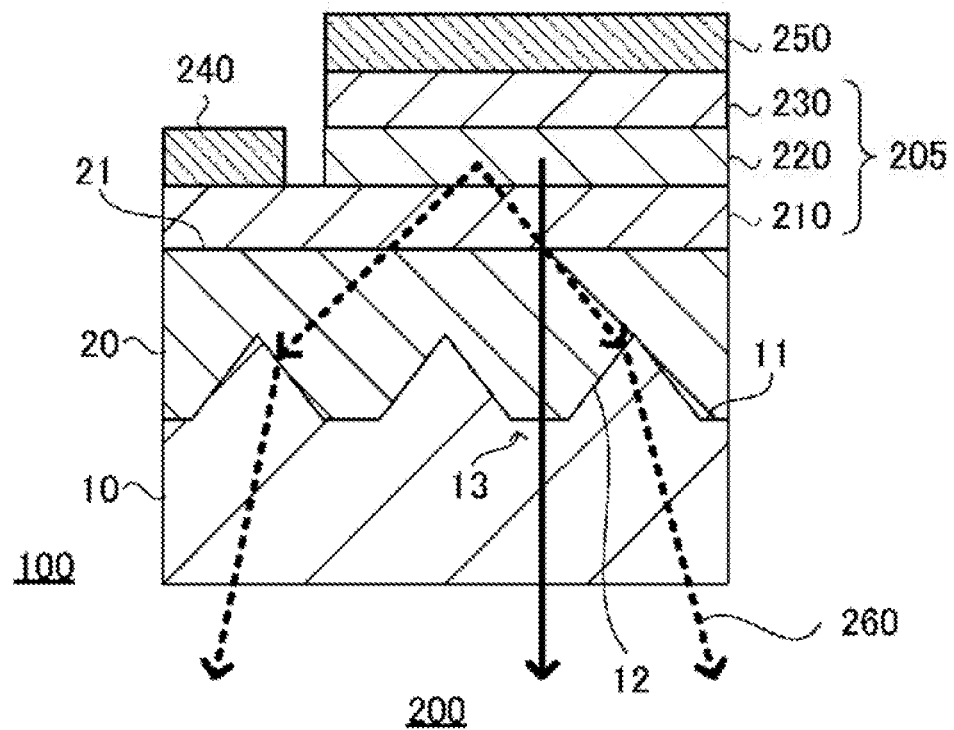
FIG. 5 is a schematic cross-sectional diagram of an LED in an application example.

To present an application example, a UV-LED 200 (also referred to as "LED 200" below) as a light-emitting device equipped with the laminate member 100 will now be described. FIG. 5 is a schematic cross-sectional diagram of the LED 200. The LED 200 includes: the laminate member 100; a light-emitting structure 205 disposed on the surface 21 of the layer 20 and formed from a laminate of group-III nitride semiconductor layers; and an n-side electrode 240 and a p-side electrode 250 serving to apply a current to the light-emitting structure 205.

Various structures may be used for the light-emitting structure 205, according to the given requirements. The light-emitting structure 205 may include, for example: an n-type semiconductor layer 210 formed on the surface 21 of the layer 20; a light-emitting layer 220 formed on the n-type semiconductor layer 210; and a p-type semiconductor layer 230 formed on the light-emitting layer 220. If required, the light-emitting structure 205 may also include a strain relaxation layer between the AlN layer 20 and the n-type semiconductor layer 210.

The strain relaxation layer may be formed in the form of a composition gradient layer or a superlattice layer, for example. The n-type semiconductor layer 210 may be formed in the form of an n-type AlGaN layer, for example. The light-emitting layer 220 may be formed in the form of a multi quantum well layer in which AlGaN layers having dissimilar Al compositions are laminated on one another, for example. The p-type semiconductor layer 230 may be formed in the form of a laminate of an electron-blocking layer formed from Al-rich p-type AlGaN, a p-type AlGaN layer, and a p-type GaN contact layer, for example. The AlGaN layers have such Al compositions that the layers are transparent to a given emission wavelength. The layers forming the light-emitting structure 205 may be formed using MOCVD, for example.

The n-side electrode 240 and the p-side electrode 250 are formed on the n-type semiconductor layer 210 and the p-type semiconductor layer 230 of the light-emitting structure 205, respectively. A Ti/Al electrode may be used as the n-side electrode 240, for example. An Ni/Au electrode, Ni/Al electrode, or Rh electrode may be used as the p-side electrode 250, for example.

Ultraviolet (UV) light 260 (also referred to as "light 260" below) generated in the light-emitting layer 220 is extracted from the back surface side of the substrate 10 to the outside. FIG. 5 exemplifies some paths of light 260. Light 260 that has been generated in the light-emitting layer 220 and has perpendicularly entered the flat valley 13 in the substrate 10 advances in the same direction and is extracted from the back surface side of the substrate 10 to the outside. Light 260 that has been generated in the light-emitting layer 220 and has entered the slant surface of the bump 12 on the substrate 10 obliquely is refracted by the slant surface and extracted from the back surface side of the substrate 10 to the outside.

Since there are substantially no voids in the layer 20, a decrease in an average refractive index around the boundary between the layer 20 and the substrate 10 that is otherwise caused by voids is prevented. Accordingly, light 260 generated in the light-emitting layer 220 is transmitted to the substrate 10 side more easily, so a decrease in outputs of the LED 200 due to voids can be prevented. It should also be noted that since the substrate 10 has the bumps 12, light 260 components that are totally reflected by the base surface 11 and are not transmitted to the substrate 10 side can be reduced compared to when the entire base surface 11 of the substrate 10 is flat, and thus light extraction efficiency can be improved.

Other Embodiments

The present disclosure is not limited to the embodiment described above and may be modified in various ways as long as the spirit of the disclosure is maintained. Moreover, the various embodiments may be combined, as appropriate.

Figure 6:
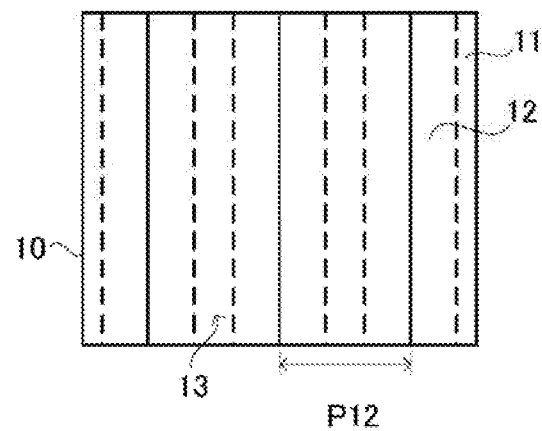
FIG. 6 is a schematic plan view of the substrate 10, exemplifying another embodiment in which ridge-like bumps 12 are distributed.

The above embodiment exemplifies a substrate 10 for growing a layer 20 that has conical bumps 12, but the bumps 12 are not limited to conical ones. Moreover, although the above embodiment exemplifies a mode in which the periodic distribution of the bumps 12 is two-dimensional, the periodic distribution of the bumps 12 is not limited to a two-dimensional one. FIG. 6 is a schematic plan view illustrating an example of a substrate 10 in which ridge-like bumps 12 are distributed periodically and one-dimensionally in such a way that the directions in which the ridges extend are parallel to one another. The solid lines and the broken lines extending in the up-down direction in the drawing indicate ridge lines and valley lines of the bumps 12, respectively.

Preferable Aspects of the Present Disclosure

Preferable aspects of the present disclosure will be supplementarily described hereafter.

[Supplementary Description 1]

An aluminum nitride laminate member including
a sapphire substrate having a base surface on which bumps are distributed periodically, each bump having a height of smaller than or equal to 500 nm, and
an aluminum nitride layer grown on the base surface and having a flat surface, there being substantially no voids in the aluminum nitride layer.

[Supplementary Description 2]

The aluminum nitride laminate member of Appendix 1, wherein the surface has a surface roughness of smaller than or equal to 3 nm in terms of a root mean square value measured over a 5 μm square area of the surface using atomic force microscopy.

[Supplementary Description 3]

The aluminum nitride laminate member of Appendix 1 or 2, wherein given that in a cross-sectional observation image (perpendicular to the surface) of the aluminum nitride layer, a line parallel to the surface and having a length of larger than or equal to 10 μm is depicted in such a way that the length over which the line traverses a void would be maximized, a void content percentage defined by the ratio of the length of the void to the length of the line (i.e. the length over which the line traverses the void) is smaller than or equal to 10%, preferably smaller than or equal to 5%, even more preferably smaller than or equal to 2%, even more preferably 0% (smaller than 0.5%).

[Supplementary Description 4]

The aluminum nitride laminate member of any one of Appendices 1 to 3, wherein the surface has a single crystal orientation and the closest low-index crystal face to the surface is a +c face of aluminum nitride forming the aluminum nitride layer.

[Supplementary Description 5]

The aluminum nitride laminate member of any one of Appendices 1 to 4, wherein the surface has a step-and-terrace structure.

[Supplementary Description 6]

The aluminum nitride laminate member of any one of Appendices 1 to 5, wherein in terms of x-ray rocking curve measurement, the aluminum nitride layer has a full width at half maximum for (0002) diffraction of smaller than or equal to 300 seconds.

[Supplementary Description 7]

The aluminum nitride laminate member of any one of Appendices 1 to 6, wherein in terms of x-ray rocking curve measurement, the aluminum nitride layer has a full width at half maximum for (10-12) diffraction of smaller than or equal to 500 seconds.

[Supplementary Description 8]

The aluminum nitride laminate member of any one of Appendices 1 to 7, wherein the surface is such that when another aluminum nitride layer is grown homoepitaxially on the surface, the other aluminum nitride layer can be grown in such a way that the amount by which a full width at half maximum of aluminum nitride forming the other aluminum nitride layer exceeds a full width at half maximum of aluminum nitride forming the aluminum nitride layer is smaller than or equal to 100 seconds, both of the full widths at half maximum being obtained for (0002) diffraction (or (10-12) diffraction) through x-ray rocking curve measurement.

[Supplementary Description 9]

The aluminum nitride laminate member of any one of Appendices 1 to 8, wherein the aluminum nitride layer is formed from an aluminum nitride layer constituted by a single layer in which there are no boundaries at which oxygen concentration changes stepwise at an intermediate position in the thickness direction.

[Supplementary Description 10]

The aluminum nitride laminate member of any one of Appendices 1 to 9, wherein the thickness of the aluminum nitride layer is smaller than or equal to 800 nm, the thickness being delimited between the lower ends of the bumps and the surface.

[Supplementary Description 11]

The aluminum nitride laminate member of any one of Appendices 1 to 10, wherein the height direction of the bumps is parallel to the c-axis direction of sapphire forming the sapphire substrate.

[Supplementary Description 12]

The aluminum nitride laminate member of any one of Appendices 1 to 11, wherein each of the bumps is conical or ridge-like, and the width of a slant surface of each of the bumps in a plan view is smaller than or equal to 500 nm.

[Supplementary Description 13]

The aluminum nitride laminate member of any one of Appendices 1 to 12, wherein a pitch between closest adjacent bumps from among the bumps is smaller than or equal to 1000 nm.

[Supplementary Description 14]

A light-emitting device including the aluminum nitride laminate member of any one of Appendices 1 to 13.

[Supplementary Description 15]

The light-emitting device of Appendix 14, wherein
the light-emitting device includes a light-emitting structure disposed on the surface of the aluminum nitride layer and formed from a laminate of group-III nitride semiconductor layers, and
light is extracted from the back surface side of the sapphire substrate.

What is claimed is:

1. An aluminum nitride laminate member comprising
a sapphire substrate having a base surface on which bumps are distributed periodically, each bump having a height of smaller than or equal to 500 nm, and
an aluminum nitride layer grown on the base surface and having a flat upper surface, there being substantially no voids in the aluminum nitride layer,
wherein a thickness of the aluminum nitride layer from lower ends of the bumps to the upper surface is larger than the height of the bumps, and
wherein the upper surface has a single crystal orientation and the closest low-index crystal face to the upper surface is a +c face of aluminum nitride forming the aluminum nitride layer.

2. The aluminum nitride laminate member of claim 1, wherein the upper surface has a surface roughness of smaller than or equal to 3 nm in terms of a root mean square value measured over a 5 µm square area of the surface using atomic force microscopy.

3. The aluminum nitride laminate member of claim 1, wherein given that in a cross-sectional observation image of the aluminum nitride layer, a line parallel to the upper surface and having a length of larger than or equal to 10 µm is depicted in such a way that the length over which the line traverses a void would be maximized, a void content percentage defined by the ratio of the length of the void to the length of the line is smaller than or equal to 10%.

4. The aluminum nitride laminate member of claim 1, wherein the upper surface has a step-and-terrace structure.

5. The aluminum nitride laminate member of claim 1, wherein in terms of x-ray rocking curve measurement, the aluminum nitride layer has a full width at half maximum for (0002) diffraction of smaller than or equal to 300 seconds.

6. The aluminum nitride laminate member of claim 1, wherein in terms of x-ray rocking curve measurement, the aluminum nitride layer has a full width at half maximum for (10-12) diffraction of smaller than or equal to 500 seconds.

7. The aluminum nitride laminate member of claim 1, wherein the upper surface is such that when another aluminum nitride layer is grown homoepitaxially on the upper surface, the other aluminum nitride layer can be grown in such a way that the amount by which a full width at half maximum of aluminum nitride forming the other aluminum nitride layer exceeds a full width at half maximum of aluminum nitride forming the aluminum nitride layer is smaller than or equal to 100 seconds, both of the full widths at half maximum being obtained for (0002) diffraction through x-ray rocking curve measurement.

8. The aluminum nitride laminate member of claim 1, wherein the aluminum nitride layer is formed from an aluminum nitride layer constituted by a single layer in which there are no boundaries at which oxygen concentration changes stepwise at an intermediate position in the thickness direction.

9. The aluminum nitride laminate member of claim 1, wherein the thickness of the aluminum nitride layer is smaller than or equal to 800 nm, the thickness being delimited between the lower ends of the bumps and the upper surface.

10. The aluminum nitride laminate member of claim 1, wherein the height direction of the bumps is parallel to the c-axis direction of sapphire forming the sapphire substrate.

11. The aluminum nitride laminate member of claim 1, wherein each of the bumps is conical or ridge-like, and the width of a slant surface of each of the bumps in a plan view is smaller than or equal to 500 nm.

12. The aluminum nitride laminate member of claim 1, wherein a pitch between closest adjacent bumps from among the bumps is smaller than or equal to 1000 nm.

13. A light-emitting device comprising an aluminum nitride laminate member, the aluminum nitride laminate member comprising a sapphire substrate having a base surface on which bumps are distributed periodically, each bump having a height of smaller than or equal to 500 nm, and an aluminum nitride layer grown on the base surface and having a flat upper surface, there being substantially no voids in the aluminum nitride layer, wherein a thickness of the aluminum nitride layer from lower ends of the bumps to the upper surface is larger than the height of the bumps, and wherein the upper surface has a single crystal orientation and the closest low-index crystal face to the upper surface is a +c face of aluminum nitride forming the aluminum nitride layer.

14. The light-emitting device of claim 13, wherein the light-emitting device includes a light-emitting structure disposed on the upper surface of the aluminum nitride layer and formed from a laminate of group-III nitride semiconductor layers, and light is extracted from the back surface side of the sapphire substrate.

\* \* \* \* \*